United States Patent [19]

Halaviati et al.

[11] Patent Number: 5,325,309
[45] Date of Patent: Jun. 28, 1994

[54] METHOD AND APPARATUS FOR INTEGRATED CIRCUIT DIAGNOSIS

[75] Inventors: Ramin Halaviati, Capitola; Nanjunda Shastry, Santa Clara, both of Calif.

[73] Assignee: LSI Logic Corporation, Milpitas, Calif.

[21] Appl. No.: 694,291

[22] Filed: Apr. 30, 1991

[51] Int. Cl.$^5$ .............................................. G06F 15/60
[52] U.S. Cl. ............................... 364/488; 364/489; 364/578
[58] Field of Search ............... 364/488, 489, 490, 491, 364/578; 395/157, 160; 371/22.3

[56] References Cited

U.S. PATENT DOCUMENTS

| | | | |
|---|---|---|---|
| 4,805,113 | 2/1989 | Ishii et al. | 364/491 |
| 4,813,013 | 3/1989 | Dunn | 364/488 |
| 4,833,619 | 5/1989 | Shimizu et al. | 364/489 |
| 4,970,664 | 11/1990 | Kaiser et al. | 364/488 |
| 5,005,136 | 4/1991 | Van Berkel et al. | 364/490 |
| 5,034,899 | 7/1991 | Schult | 364/488 |
| 5,111,413 | 5/1992 | Lazansky et al. | 364/578 |

Primary Examiner—Vincent N. Trans
Attorney, Agent, or Firm—Gerald E. Linden; Michael Rostoker

[57] ABSTRACT

A technique for pinpointing and analyzing failures in complex integrated circuits is disclosed. A tester stimulates the a device (DUT) with input patterns. DUT output patterns are communicated back to the tester, and are compared to simulation results. Failing outputs are identified. Working back from the failing output, suspect failing nodes are identified in a schematic editor. Through a layout database linked to the schematic editor, the position of each suspect failing node is identified. A probe and SEM are positioned at nodes suspected of causing the failure. Live waveforms generated by the probe are compared with simulated waveforms for the node, while the DUT is being re-exercised by the tester. In a windowed display environment, the user is provided with schematic, layout, SEM image, and live and simulated waveforms for the suspect node. Node after node are explored in this manner until the failing circuit element is identified. Documentation is provided by printing any and all of the windows.

5 Claims, 6 Drawing Sheets

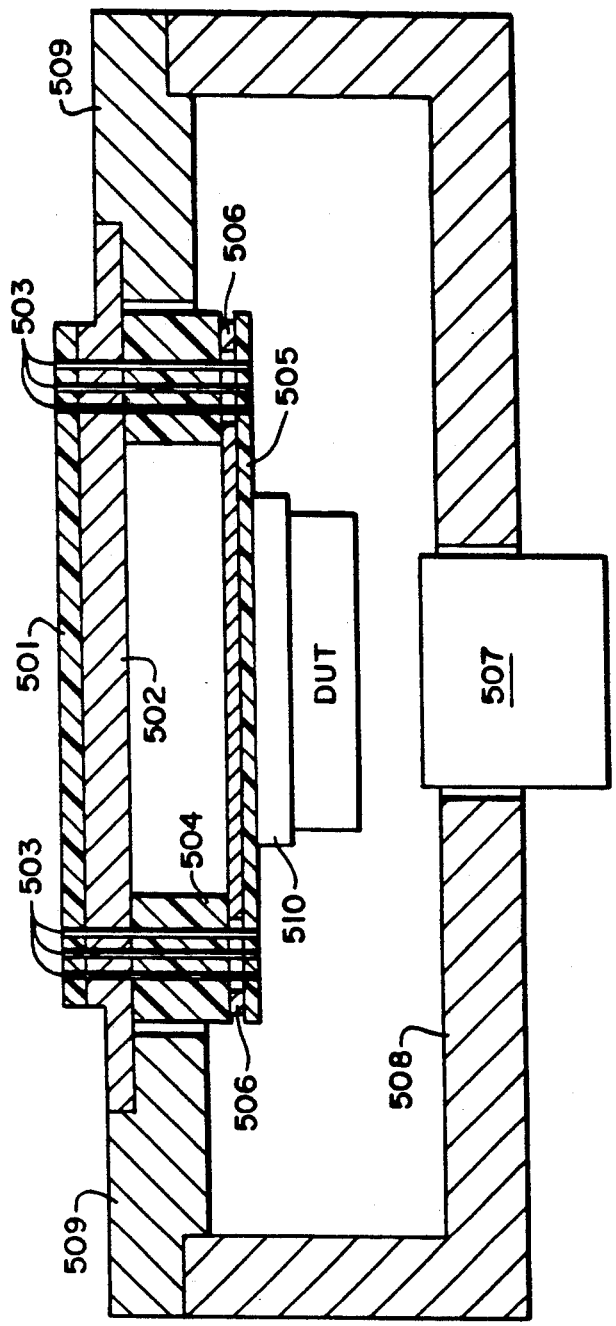
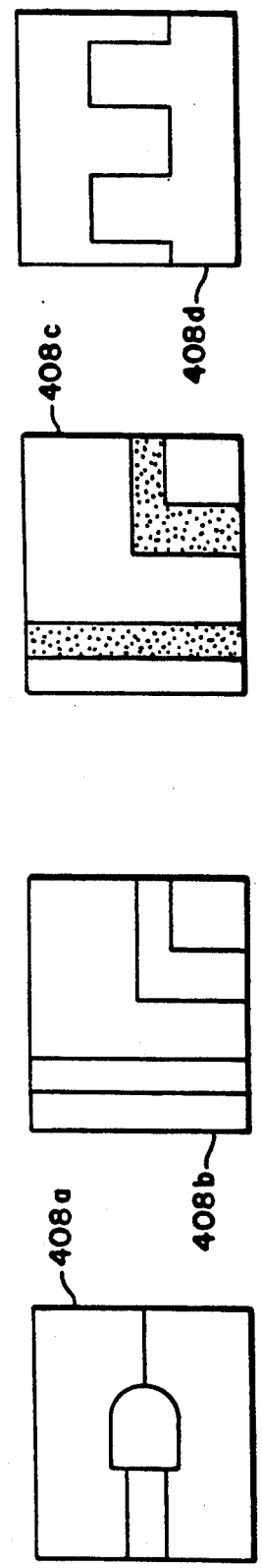

METHOD AND APPARATUS FOR INTEGRATED CIRCUIT DIAGNOSIS

TECHNICAL FIELD OF THE INVENTION

The invention relates to the design, analysis and debugging of complex integrated circuit devices, particularly ASICs.

BACKGROUND OF THE INVENTION

Modern ECAD (Electronic Computer-Aided Design) systems facilitate the design of electronic circuits by providing a user with a set of software tools running on a digital computer These software tools generally include a schematic editor, a schematic compiler, and a simulator.

The schematic editor of the ECAD system is usually an interactive software tool which enables the user to select from a number of circuit elements which are graphically displayed upon a graphical/text display device (e.g., display screen) connected to the computer. These displayed elements may then be interconnected by the user drawing lines, or the like, with a position input device, which may be a pointing device such as a mouse, trackball, joystick, graphic tablet, or keyboard used to enter coordinates on the display screen and commands to the software tool.

The circuit elements and their interconnections form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for heirarchical design whereby a previously created and stored circuit or circuit element may be recalled, viewed and re-used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

Typically, the form of user interaction with the schematic editor is an object-oriented screen display whereby the user manipulates objects on the screen through the use of a pointing device. A pointing device is any device through the use of which a user may "point" to and identify objects on a display screen. Such object-oriented interfaces are well known to those skilled in the art. One example of such and interface is the Macintosh Finder for the Apple Macintosh computer, both produced by Apple Computer, Inc. Another example of such an interface is that of Microsoft Windows, produced by Microsoft Corp. of Redmond, Wash.

In order to simulate the performance of the circuit, it is necessary to run a simulator. A simulator is a software tool which operates on: a digital representation, or simulation model of a circuit, a list of input stimuli (test vectors) representing physical inputs, and data about the performance characteristics of the represented circuit elements; and generates a numerical representation of the response of the circuit, and individual circuit elements, which may then either be viewed on the display screen as a list of values or further interpreted, often by a separate software program, and presented on the display screen in graphical form. Typically, the graphical presentation is designed to produce an image similar to what one would see on an oscilloscope or logic analyzer screen monitoring a physical circuit connected as described in the schematic diagram if the physical inputs represented by the list of simulation input stimuli were applied. The simulator may be run either on the same computer which is used for schematic entry, or on another piece of electronic apparatus specially designed for simulation. Simulators which run entirely in software on a general purpose computer, whether the same as or different from the one used for schematic entry, will hereinafter be referred to as software simulators. Simulations which are run with the assistance of specially designed electronic apparatus will hereinafter be referred to as hardware simulators.

Examples of software simulators are found in the following patents, incorporated by reference herein: U.S. Pat. Nos. 4,891,773, 4,918,594, 4,922,445 and 4,924,430.

Examples of hardware simulators are found in the following patents, incorporated by reference herein U.S. Pat. Nos. 4,587,625 and 4,924,429.

Returning to ECAD software-based simulators, simulation is often provided by utilizing simulation models at one or more of several different levels. Component-level models attempt to describe the exact behavior of a specific component, such as a gate or transistor, when it is acted upon by a stimulus or stimuli. Behavioral-level models provide a simplified model of extremely complicated devices, such as a microprocessor, or an operational amplifier. Such models, if simulated exactly on a transistor by transistor basis, would become prohibitive in terms of the size of their descriptions and the number of calculations and amount of computing time required to completely simulate their function. In response to this, the behavioral-level model provides a logical or mathematical equation or set of equations describing the behavior of the component, viewed as a "black box". Such models may either provide a very complete and accurate description of the performance of the modeled device, or a simple description of the types of signals one might expect the modeled device to produce. For example, a behavioral model of a microprocessor might provide the user with the capability of issuing various types of bus cycles, but not the capacity to actually simulate the execution of a program. Circuit-level models typically comprise a plurality of component-level and/or behavioral-level models and the descriptions of their interconnections for the purpose of simulating the performance of a complete circuit comprising a number of interconnected components. Simulations of heirarchical designs require that the included macro-level components also be simulated. Circuit-level or behavioral-level models of the macro-level components may be used to simplify this task.

The simulation model used by the simulator is usually derived from the output of the schematic editor by a schematic compiler, also making use of information about performance characteristics of the circuits, often stored in simulation libraries. Simulation libraries contain simulation characteristics of numerous circuit components and are typically maintained in files on the computer's on-line storage devices. The schematic compiler is a software tool which interprets the circuit element and interconnection information generated by the schematic editor and the performance characteristics stored in the simulation libraries, and reorganizes and translates them into the simulation model for the circuit. Occasionally, either the simulator or the schematic editor includes the function of a schematic compiler, in which case, separate compilation is not required.

Simulators often allow several different types of simulation. One type is a complete simulation run, where an initial set of conditions is specified, a set of input stimuli is defined and the duration of the simulated run is specified. The simulator then operates on the data and produces a file of the results which may be displayed. Another type of simulation, similar to the complete simulation run is an event-terminated run, whereby the simulation is run until a certain pre-specified event occurs in the simulation results. The simulation may be terminated immediately at that point, or run for some simulated duration afterwards. Another type of simulation run is a stepped simulation run, whereby the current simulation may be "stepped" by one unit of time, or one clock cycle, or some other similar criterion.

In summary, the process of designing an electronic circuit on a typical ECAD system is done in several discrete steps. A schematic diagram of the circuit is created and modified interactively through the use of a schematic editor which produces a digital representation of the circuit elements and their interconnections. The user of the ECAD system then prepares a list of input stimuli representing real input values to be applied to the simulation model of the circuit. The digital representation of the circuit is then compiled by a schematic compiler and translated into a form which is best suited to simulation. This new, translated representation of the circuit is then acted upon by a simulator, which produces numerical output analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The Modular Design Environment ("MDE") produced by LSI Logic Corporation of Milpitas, Calif., is a suite of software tools for computers running the UNIX operating system produced by AT&T Corporation. For purposes of this discussion, MDE (resident in an appropriate workstation) shall be considered an ECAD system.

MDE comprises a schematic editor (LSED) and a simulator (LSIM), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

In modern digital systems, designs incorporating 100,000 logic gates are not uncommon Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

After the design and simulation process is completed, to the designer's satisfaction, a physical device will be created. Often, device design data generated by the ECAD system is provided to a layout tool, which may be resident in the ECAD system and which generates data for controlling the production of masks for fabrication (e.g., photolithography) equipment.

After a physical device is created, it must be tested to verify its functionality. Various stand-alone testers are capable of generating signals to be applied as input signals to the device, and measuring response at the device output. First, however, the test vectors must be generated, and these may be derived from the ECAD system's simulation stimuli. When, however, a fault is indicated, the tester can only provide "gross" information about the manifestation of the fault as indicated by a faulty voltage level on an output pin. In order to identify the source of the fault, in the past it has been required to manually trace the fault back from the output pin, generating a "fault tree" of candidate gates, nets, and the like, (i.e., "circuit elements") that are malfunctioning, and physically examine the condition of each of these candidate sources of error.

Examples of logic testers are found in the following patents and publications, incorporated by reference herein: U.S. Pat. Nos. 4,928,278, 4,726,025 and 4,705,970 and *Application Note,* "Automated Digital Signal Processing" (Massachusetts Computer Corporation, 080-00976-00 0887-976).

In order to probe individual gates, or parts of gates, such as particular diffusion areas, vias, contacts, polysilicon structures, metallization layers, and the like, a probe tool having extremely fine resolution is required Physical probing tools are somewhat effective, but tend to damage the device. Non-contacting probes, such as an electron beam (e-beam) prober, offer positional resolution on the order of 0.2 $\mu$m, and are non-destructive.

One example of an e-beam prober is the IDS 5000 E-Beam Prober, available from Schlumberger Technologies. The IDS 5000 is able to measure the state at precise locations (e.g., individual nets) on a device-under test ("DUT"). In the IDS 5000, an electron optical system produces a focused electron beam small enough to probe the most advanced device geometries (e.g., down to 0.3 microns). The following "tools" are also included in the IDS 5000:

An interactive positioning tool is provided for positioning the e-beam probe.

A Scope Tool is provided for displaying "live" waveforms at selected positions on the device, as detected by the e-beam probe.

A "navigational" tool is provided, which can be loaded with schematic, netlist, and layout representations of the DUT, to facilitate backtracking from one level of representation to another, without manual signal tracing.

A Scanning Electron Microscope (SEM) Tool provides a voltage-contrast image of the DUT in real time, and shows the logic states of different nets.

A pointer in the SEM or layout displays can be moved interactively, and the signal detected by the probe at a corresponding point on the DUT is continuously displayed in the Scope Tool.

A Layout Tool allows the user to "browse" through the downloaded physical layout of the DUT and locate a particular signal without referring to hard-copy plots. The Layout Tool has a notion of hierarchy, and subcells can be exploded.

A Schematic Tool graphically displays the downloaded schematic of the DUT, which is transferred to the IDS from outside the system. With this tool, the user is able to "browse" through the design, and links to the Layout Tool allow selection of a net in the schematic and corresponding net in the Layout Tool. A netlist text file can also be downloaded and displayed, and used in a similar manner.

DUTs can be tested by connecting to a tester, and increasing clock speeds until a DUT starts to fail, and comparing signal measurements at the various clock speeds. A Dynamic Fault Imaging Application Tool can acquire a sequence of stroboscopic measurements from a known good device and compare these images with a similar sequence from a device-under-test (DUT).

Equipment such as the IDS 5000 has enormous capability to measure signal levels at precise locations on physical implementations of complex devices, and it has a reasonably friendly user interface to allow interactive positioning of the e-beam probe, once schematics and layouts (and netlists) are loaded.

Generally, ECAD systems do not test physical devices, but they can be used to generate test vectors for the tester exercising the input pins of the device. Neither testers nor probers have the capability of running gate-level simulations.

What is needed is a technique for integrating a powerful, full-featured ECAD system, having the ability to simulate and analyze complex circuits, with a tester capable of exercising the inputs of DUTs, with a probe tool for monitoring a device at specific locations. Such an integrated system is disclosed herein.

DISCLOSURE OF THE INVENTION

It is therefore an object of the present invention to provide an integrated diagnosis system for physical integrated circuit devices (DUTs), particularly gate-intensive ASICs (Application-Specific Integrated Circuits).

It is a further object of the present invention to provide a technique for utilizing an existing ECAD system for physical integrated circuit devices.

According to the invention, an ECAD system having schematic entry, schematic editing, layout and simulation capability, provides test vectors to a tester, for exercising the inputs and measuring the outputs of a device under test (DUT). The ECAD system also communicates layout information to the position control tool of a non-contact prober, such as an e-beam probe, preferably having a scanning electron microscope (SEM) associated therewith.

When an I/O fault is detected, as indicated by comparing the DUT output to simulation results, potential sources of the error are explored in the ECAD system, preferably in the schematic editor. These sources include circuit elements, gates, nets, nodes, and the like, which may be represented at various hierarchical levels, such as from schematic to layout. Generally, they are most conveniently explored at the schematic level.

Once candidate error sources ("suspect elements") are identified, the probe is positioned to measure the voltage level at the suspect element, and the DUT is re-exercised by the tester. In this manner, the source of the output error can be pinpointed to a specific logic element, such as a diffusion area, via, contact, polysilicon area, or metallization area, and the like.

According to a feature of the invention, a scanning electron microscope is linked to the probe, to provide a visual representation of the candidate source of error, and areas around the source. This visual image is helpful in finding and documenting the location of the candidate error source, and state levels can be visually presented.

According to a feature of the invention, simulation waveforms are viewed along with actual waveforms measured by the probe. Relevant portions of the schematic and layout can also be presented in a windowed environment, along with the corresponding SEM image. All of these graphical representations can be printed to document the failure and its source.

Other objects, features and advantages of the invention will become apparent in light of the following description thereof.

BRIEF DESCRIPTION OF THE DRAWINGS

FIGS. 4A-4D are views of windows in a display device, such as the display device 106 in FIG. 1

FIG. 5 is a cross-sectional view of a representative hardware interface for use in conjunction with the present invention.

DETAILED DESCRIPTION OF THE INVENTION

Figure 1:
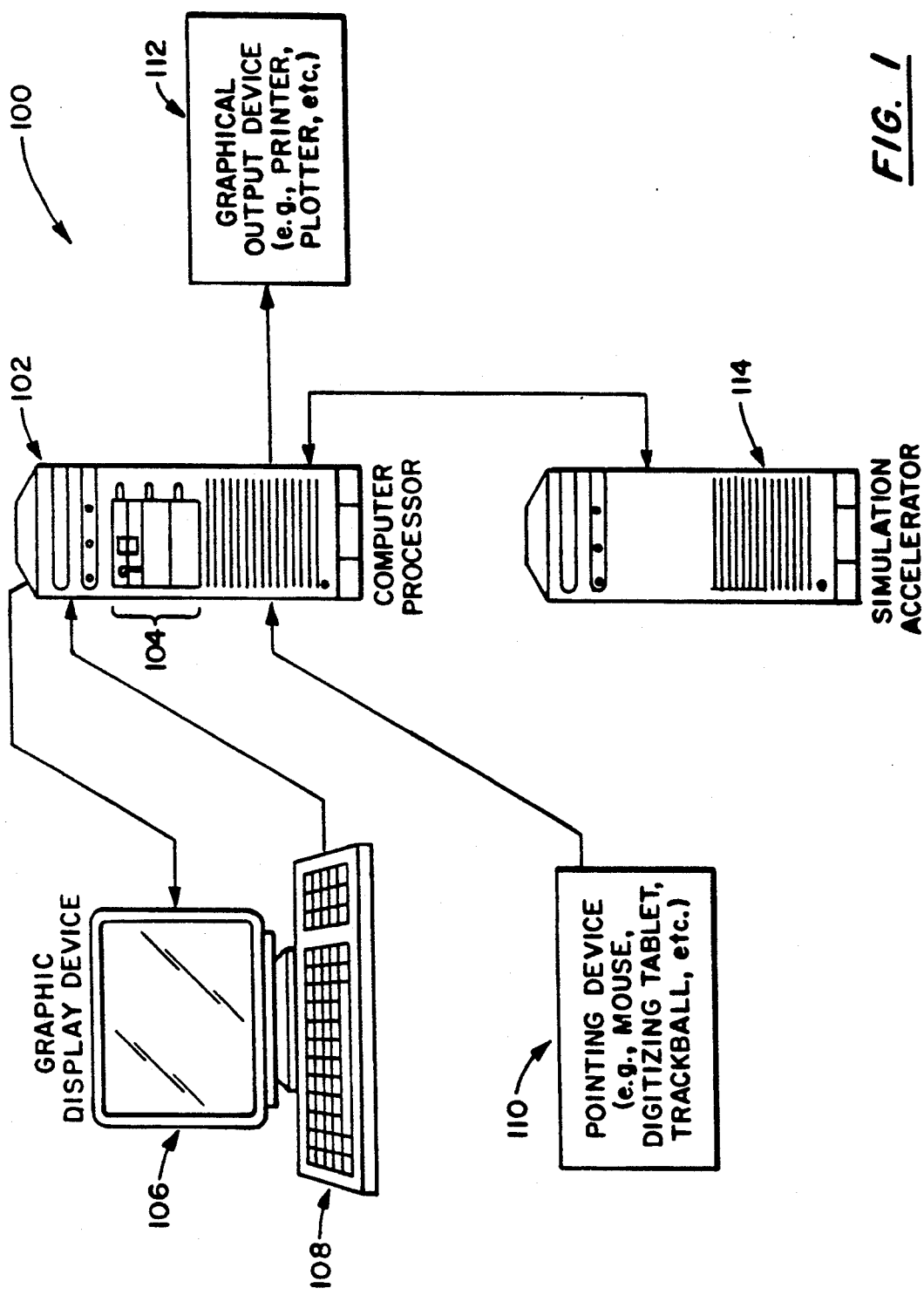
FIG. 1 is diagram of typical ECAD system hardware, such as may be employed in the present invention.

FIG. 1 shows an ECAD system 100, which includes a computer processor 102 with mass storage devices 104, a graphical display device 106, a keyboard 108, a pointing device 110, a graphical output device 112, and preferably a simulation accelerator 114. The pointing device 110 may be a mouse, digitizing tablet, trackball, joystick, or any other similar cursor positioning device. The graphical output device 112 is intended for hard copy output of schematic diagrams and for the printing of layout artwork, as well as for printing out any other displays discussed hereinbelow.

Figure 2:
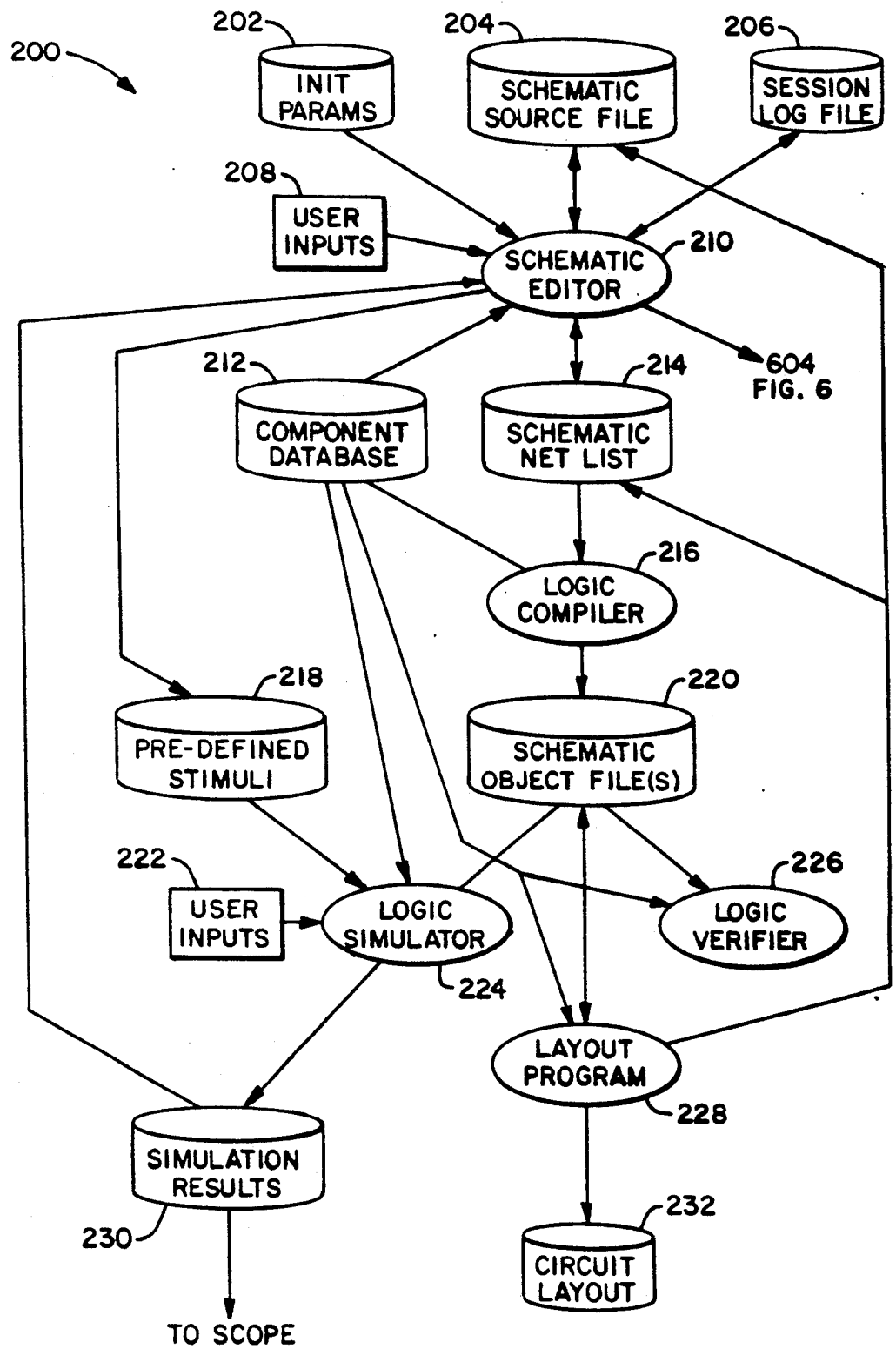
FIG. 2 is a software block diagram of representative ECAD system software, such as may be loaded into the system of FIG. 1.

FIG. 2 illustrates that there is resident within the ECAD system (100 of FIG. 1) a software system 200 comprising a number of data structures and programs. Upon initial startup, a schematic editor 210 reads in a series of initialization parameters 202 which set default mode selections and various configuration parameters. The schematic editor may be the LSED editor by LSI Logic Corp.

The schematic editor 210 accepts input from a schematic source file 204, and displays its graphical representation on the ECAD systems's graphical display screen (106 with respect to FIG. 1). If there is no schematic source file, it is assumed that a new schematic is being entered, and a blank entry sheet is presented on the display screen and a new, blank schematic source file 204 is created. The schematic editor 210 operates according to commands coming from user inputs 208. Every command entered is recorded in a session log file 206 such that the editor may undo any number of commands entered by the user. Some commands from the user inputs 208 will be requests to place and interconnect schematic symbols on the display screen. To accomplish this, the schematic editor 210 looks up the requested component(s) in a component database 212 and retrieves graphical symbol representations of the requested component(s) contained therein. As the user enters the schematic diagram on the screen, the schematic editor creates a net list 214 and invokes the function of a logic compiler 216.

The schematic editor preferably includes:

1. The ability to provide status indicators on each component and net indicating "activated" or "deactivated" and "eligible for simulation" or "ineligible for simulation".

2. The ability to enable the user to simulate data values by pointing to nodes or nets and specifying data values and conditions. These data values and conditions will be stored in a data structure 218 as pre-defined stimuli. Said data values and conditions may be the same data values and conditions already accepted by the LSIM simulator, produced by LSI Logic Corp.

3. The ability to enable the user to request simulator functions. The set of simulator functions can be those already accepted by LSI Logic Corporations LSIM simulator.

4. The ability to permit the schematic editor to signal (in software) the logic compiler and logic simulator to begin operation.

5. The ability to permit the schematic editor to detect when requested simulator and/or compiler operations have been completed and to detect status information returned by those programs (such as: specified simulation conditions met/not met, etc..).

6. The ability to enable the user to identify small display areas adjacent to schematic nodes and/or nets for the display of simulation data relating to such nodes or nets. The internal representations of such display areas will contain indications of the type of display requested: textual state data or graphical timing data.

7. The ability to allow the user to set aside a display area or display areas for the display of state table information. Such commands will require that the user identify the signals to be included in the state table, provide stepping conditions for the simulator, optionally provide initial conditions for the first simulation run (through the mechanism step 2., above), and the number of steps to perform or some special ending conditions (through the mechanism of LSED editor (see step 3., above).

8. The ability of the schematic editor to permit iterative calls to the simulator according to user specifications (see step 7, above), to wait each time the simulator is invoked until the requested operation is completed, and to read the simulator state information contained in the simulation results file 230, and retrieve the state data corresponding to the user specified values to be entered into a state table or state tables and format it for display in columns under the corresponding signal name heading in the state table, each time advancing one line.

9. The ability of the schematic editor to retrieve state information from the simulation results file 230, to identify it by node or net name, and to format it for display as a textual logic state in its corresponding pre-allocated display area marked for textual state display (set up by the user in step 6., above).

10. The ability of the schematic editor to retrieve state history information for the simulation results file 230, to identify it by node or net name, and to format it for display as a graphical timing diagram in its corresponding pre-allocated display area marked for graphical timing display (set up by the user in step 6., above).

11. The ability of the schematic editor to store the interactive state data for viewing at another time, create macros to move through the interactive simulation in defined steps or to cycle a clock, pop up existing or user-defined data sheets on any library element being used.

By way of example, the logic compiler 216 may be the LCMP compiler marketed by LSI Logic Corp., or the like. Using the information in the schematic net-list 214 and the component data in the component database 212, the logic compiler creates a schematic object file or files, the structure(s) of which is(are) optimized for simulation, verification and layout (respectively).

The logic compiler 216 may accept its command stream from the schematic editor 210 rather than directly from user inputs. The logic compiler 216 may also provide notification to the schematic editor 210 that it has completed its operation. The logic compiler 216 may also read parameters in the net-list identifying components and nets which have been de-activated. In response to a "deactivated" component or net, the logic compiler 216 will simply skip over that component or net, effectively ignoring it and removing it (temporarily) from the design until it is again marked as "activated". The logic compiler 216 may also operate only on data in the schematic net list which has changed since the last compilation (incremental compilation), thus providing significantly reduced compile times, which, while desireable, is not strictly necessary for function.

A logic simulator 224 operates on the schematic object file 220 and component simulation performance contained in the component database 212 according to a set of initial conditions and/or signal conditions specified as pre-defined stimuli 218. For standalone operations, simulator 224 may also operate off of user inputs 222.

The logic simulator 224 may be the LSIM logic simulator marketed by LSI Logic Corp., and preferably has the following functionality:

1. The ability to accept its commands and parameters from the schematic editor 210, rather than from direct user input.

2. The ability to return status about stopping conditions to the schematic editor upon completion of its simulation.

3. The ability to provide simulation output results in a data structure 230, as well as to a graphical device.

A logic verifier 226 performs design-rule checking of the schematic diagram captured by schematic editor 210 by checking the components and their interconnections contained in the schematic object file 220 against component interconnection and loading rules stored in component database 212.

Finally, a layout program 228 places components and routes their interconnections as they would be implemented on a semiconductor chip, and stores the layout in a layout file 232.

The physical integrated circuit device (not shown in FIGS. 1 and 2) ) is produced, preferably using the data contained in the circuit layout file 232, and must undergo physical testing.

Design, layout and simulation tools of the type described are found in LSI Logic's MDE (ECAD system).

Figure 3:
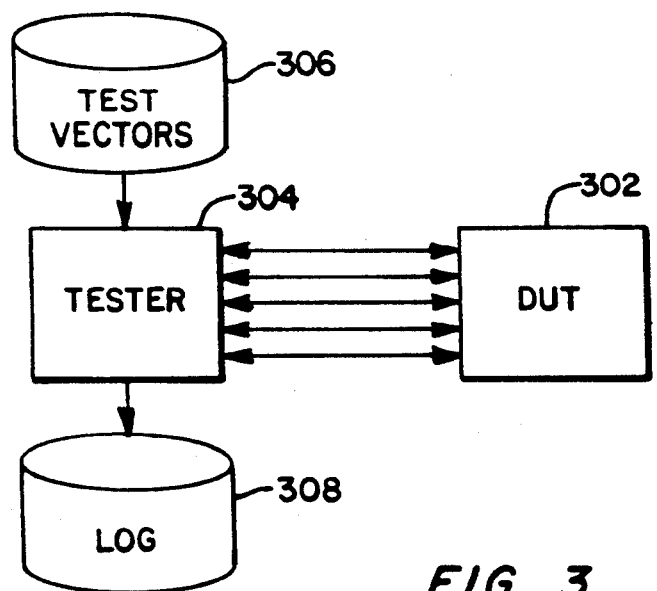
FIG. 3 is a block diagram of a device-under-test (DUT) connected to a tester, such as a logic analyzer

FIG. 3 shows an integrated circuit device 302 connected to a tester 304. From this point forward, the device will be referred to as a device-under-test ("DUT"). As is known, the tester provides input stimuli to the input pins of the device, and output patterns are data logged. To this end, the tester is provided with a set of test vectors 306 (such as may be derived from simulation data base 218 of FIG. 1), and provides output patterns to a suitable storage device (file) 308 for analysis.

Usually, such I/O testing techniques are limited (in speed) by various factors. The tester output capacitance, which typically ranges from 35 pf to 110 pf, can prohibit running the system to full ("rated") speed. The input rise/fall time mismatch between system application and tester can also cause a correlation problem. Output impedance mismatches can cause reflection and ringing, and custom terminations for each pin may be needed. Another problem is potential ground bounce, causing double clocking, due to all inputs switching at the same time right before the clock edge with a fast slew rate.

However, in commonly-owned U.S. patent application No. 632,012, entitled AT-SPEED TESTING OF CORE LOGIC and filed on Dec. 12, 1990 by Bandali and King, a technique for at-speed testing of the core logic of a digital integrated circuit device is disclosed. Test patterns are applied to the circuit inputs while applying a "burst" of three clock pulses followed by a "dead cycle" to the pipeline stages between the input logic, the core logic and the output logic. During the dead cycle, changes in the output of the device are observed during the dead cycle. Subsequently, a second burst of clock pulses, offset from the first burst, and followed by a dead cycle, is applied with re-initialized test patterns, and the outputs are observed during the dead cycle. Subsequently, a third burst of clock pulses, offset from the first and second bursts, and followed by a dead cycle, is applied with re-initialized test patterns, and the outputs are observed during the dead cycle. The results of the three iterations of the test are stored and merged to provide a valid indication of the performance of the device with a free running clock.

Irrespective of the physical limitations of testers, they are only capable of providing a data log of output patterns They are simply incapable of directing the designer to specific internal circuit elements that are causing the failure.

In order to identify nodes suspected of causing the failure, for whatever reason (poor fabrication, faulty design, etc.), the designer must work back into the design of the device from the failing output, checking each path that connects thereto, and creating a "failure tree" for rigorous node-by-node analysis. Then, the designer must measure voltages at each suspect node, while the DUT is being exercised by the tester. Physical probing techniques are slow and destructive, which can leave the problem unsolvable.

With the use of modern non-destructive probes, such as an electron beam (e-beam) probe, the designer has the opportunity to explore the failure tree, node-by-node, until the fault is located.

Figure 4:
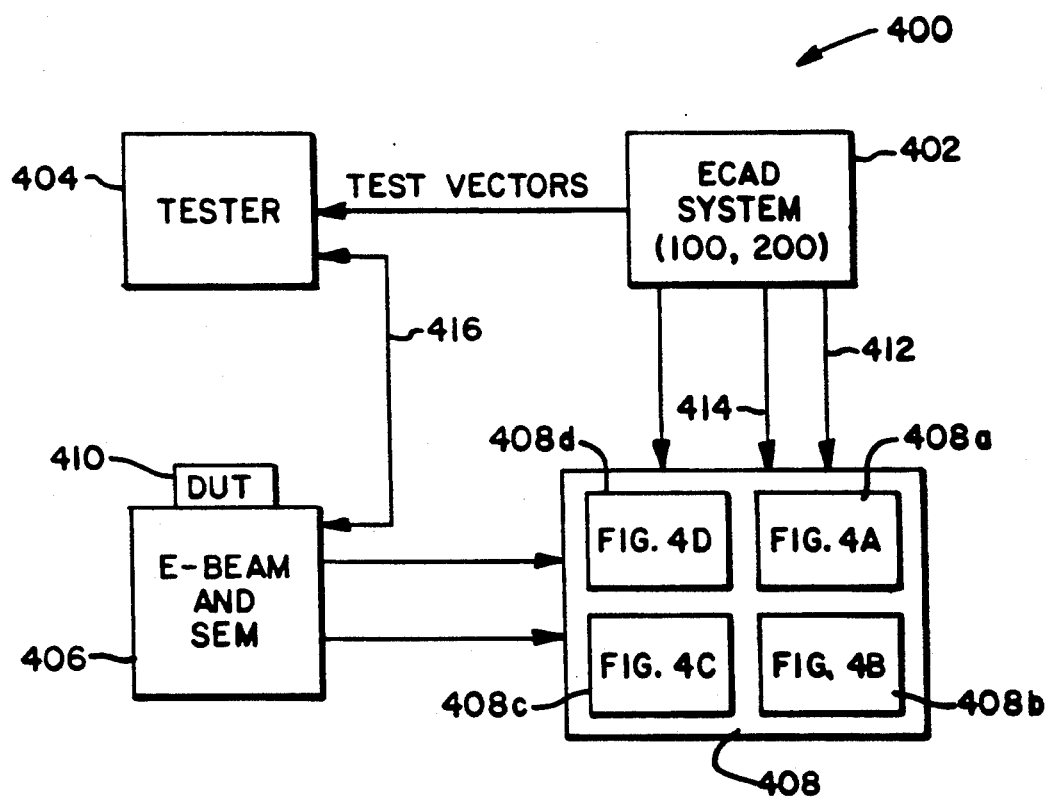
FIG. 4 is a block diagram of the integrated diagnosis system of the present invention.

FIG. 4 shows the integrated test system 400 of the present invention, which includes the following major components:

an ECAD system 402, such as the one described with respect to FIGS. 1 and 2 (e.g., such as LSI Logic's MDE);

a tester 404, such as described above (e.g., a logic analyzer);

a noncontact probing device 406 suitable, at least, for making electrical measurements at specific nodes on a DUT, and preferably having an electron microscope (SEM) associated therewith; and 5 a display device 408, such as the display 106 described in FIG. 1.

FIG. 4 shows a DUT 410 mounted to the probing device 406, and connected to the tester 404. The tester is suitably a VLSI tester marketed by ASIX.

The probing device 406 may be the IDS 5000 E-Beam Prober, described above.

The display device 408 may be the display contained in the IDS 5000, and is suitable for displaying information in four-windows 408a–d. Exemplary window displays are shown in FIGS. 4A–4D.

FIG. 4A shows in window 408a a logic element; FIG. 4B shows in window 408b the layout of a portion of the logic element; FIG. 4C shows in window 408c a SEM image of the same portion of the logic element; and FIG. 4D shows in window 408d a live waveform generated at the portion of the logic element.

The prober/SEM 406 contains control electronics (partially illustrated as 602 in FIG. 6) for:

a. receiving schematic and layout files downloaded over lines 412 and 414, respectively, from the ECAD system 402;

b. displaying the schematic (FIG. 4A) and layout (FIG. 4B);

c. linking the schematic and layout files;

d. positioning the probe and SEM based on the user positioning a pointer in the layout display (FIG. 4B) or SEM display (FIG. 4C);

e. displaying "live" waveforms (FIG. 4D) generated by the probe; and f. displaying SEM images (FIG. 4C).

An interface 416 between the prober 406 and the tester 404 allows for synchronization of these two units.

Hardware Integration

The standard approach for interfacing a VLSI tester to an E-beam prober is to connect individual cables from the tester test head to special load modules. A DUT is inserted into the load module, which is then placed in the vacuum chamber lid of the prober. There are many disadvantages to this approach. The most critical problem is skew between cables of different length, which may corrupt data when operating at high speeds. Other problems can arise, such as cable interconnect opens or shorts that will cause a considerable amount of time to be wasted debugging the setup.

In the present invention, the tester test head is directly mated with the specimen lid of the prober vacuum chamber. This provides a clean, cable-free interface to provide stimulus for analyzing and debugging devices with the E-beam prober.

FIG. 5 shows, generally, a suitable arrangement of a test head and a specimen lid. The specimen lid 509 is mated to a vacuum chamber bottom piece 508 and to an aluminum flange 502, and these three elements form an airtight space for containing the DUT. A tester interface printed circuit board 501 is secured to an external surface of the flange 502, and is provided with pins 503 (only a few pins shown) extending through the flange 502. On the interior surface of the flange 502, the pins 503 are supported by and extend through an insulating block 504. A printed circuit board 505 is provided inside the airtight space, and extends across the insulating block 504. The pins 503 connect to the printed circuit board 505, and a test socket 510, or the like, is provided on the bottom surface (as viewed in the figure) of the circuit board 505. The DUT plugs into the socket 510. An electron optic column 507 extends into the airtight space, through an opening in the vacuum chamber bottom piece 508, for probing the DUT, as discussed hereinabove.

Preferably, the pins 503 are "pogo" (compressible) pins, and the circuit board 505 is mounted to the insulating block 504 with aluminum spacers 506. The spacers 506 are dimensioned relatively thin for setting up the board 501, flange 502, block 504 and board 505 with the pins 503 fully compressed or somewhat thicker for setting up these elements with the pins 503 extended.

In this manner, the DUT is presented for probing to the e-beam probe, and the test head (e.g., 501, 503, 505, 510) is directly mated with the specimen lid (e.g., 509).

Software Integration

The IDS 5000 E-Beam Prober, described above, provides software tools to automate the positioning of the e-beam probe (and SEM) at a node of interest. Although these tools are very useful, they do not provide the designer or test engineer with a familiar interface. It is more helpful for them to use the in-house ECAD tools, such as the schematic editor program (LSED 210, FIG. 1) as the user-interface for positioning the probe.

This integration is achieved in a manner such that no changes are required to the schematic editor (LSED) itself. Instead, a software layer is used to communicate between the MDE (ECAD 402) and the IDS 5000 (Prober 406) programs.

Figure 6:
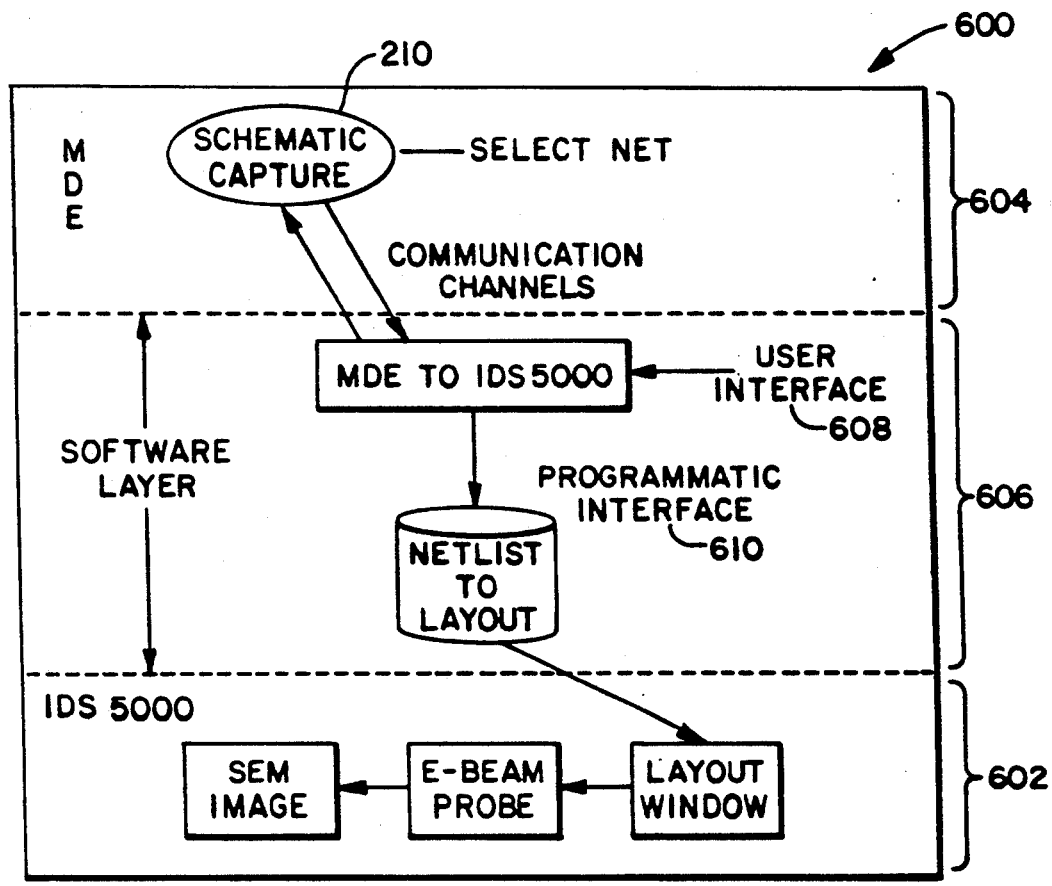
FIG. 6 is a diagram of a communications interface, according to the present invention.

FIG. 6 shows an interface 600 for positioning the probe. The schematic editor 210 of FIG. 1, is linked to the control electronics 602 of the probe (406, FIG. 4) via a communications channel 604 and a software layer 606. The software layer 606 includes a user interface 608 and a programmatic interface 610 (similar to elements 216, 220, 228 and 232 of FIG. 2).

At the core of this integration is a software program derived from LSI's LPLUMB program. A two-page code listing, entitled "link.c" is representative of this program, and uses standard UNIX TM channels ("pipes") to establish a communications link between LSED and the control electronics of the IDS 5000. The link.c program requests from LSED the name of the selected (suspect) net, and passes this name to the IDS 5000 via the programmatic interface 610, which results in positioning the e-beam (and SEM) at the area on the DUT corresponding to the net name.

Figure 7:
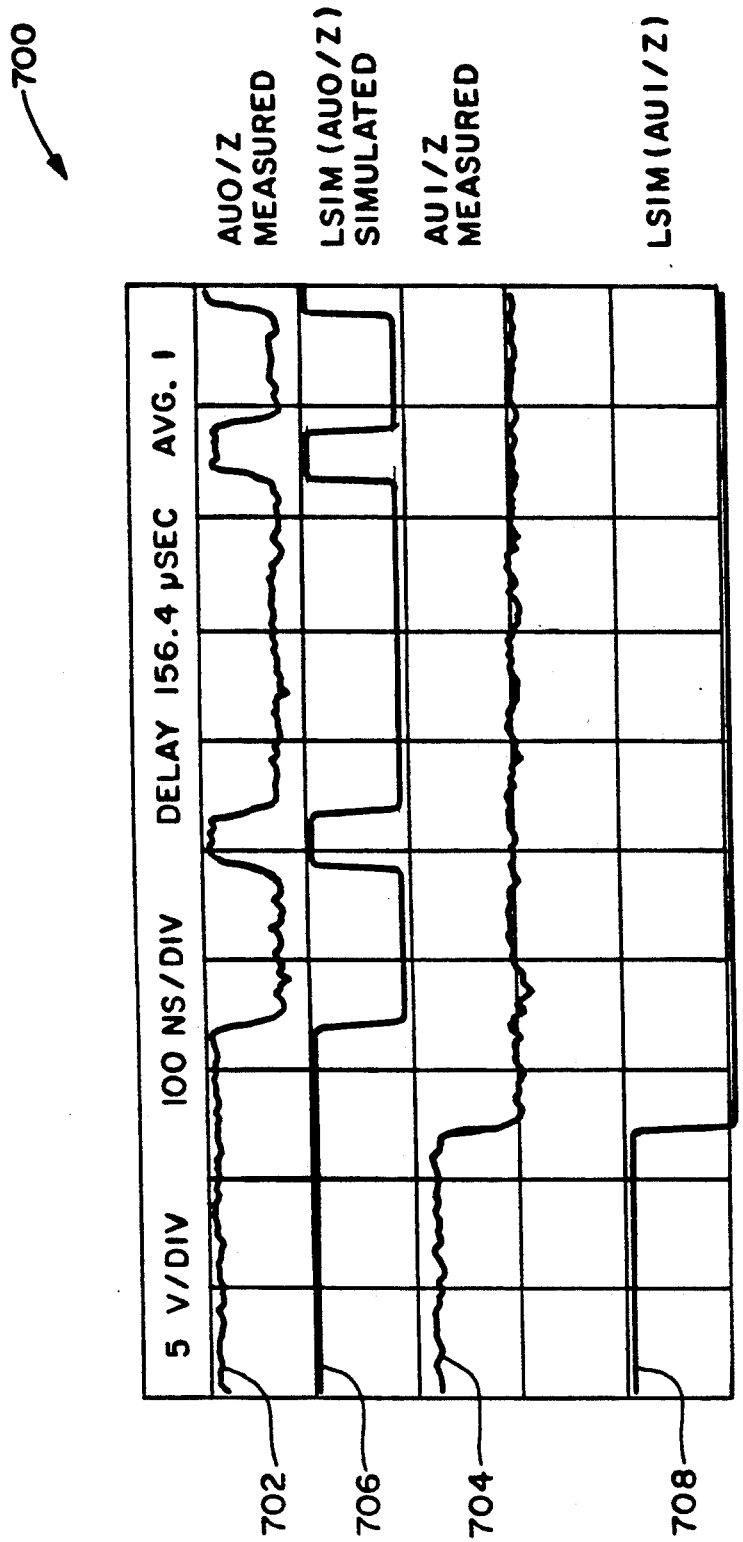
FIG. 7 is a representative display, corresponding to the display of FIG. 4D.

FIG. 7 shows an exemplary display 700 of simulated versus measured results, as would appear in the window 408d of FIG. 4D. A profound benefit of the system of this invention is its ability to display the measured signals operating in real time side-by-side with the simulation results. Two measured signals 702 and 704 are illustrated along with two corresponding simulated signals 706 and 708, respectively.

The implementation of this comparison involves two tasks: 1) a protocol to display results from MDE into the IDS scope window; and 2) a method to quickly assess the simulation results.

The protocol for communicating with the scope window is available from the IDS 5000. The scheme involves the use of shared memory. An eleven-page program, entitled "waveform.hxx", written in C++ uses this protocol to acquire information from a stored waveform on the screen (e.g., signal name, time per division, trigger time, etc.). The same program then accesses the simulation results from MDE (230, FIG. 2), builds the waveform structure in memory, and instructs the IDS 5000 scope tool (described above) to draw the software-generated waveform.

Fast access time for acquiring simulation results is absolutely necessary to make the system useful. Especially since a large number of internal nodes have to be saved by the simulator, reading the entire simulation results could take a long time. The method adopted is to index the simulation results in a fast, effective way with low processing overhead. The simulator records the results chronologically, from start time to end time. At each time, one or more events are listed, in the following format [signal name][value]:

time 0: [signal 1][value], [signal 2][value]

time n: [signal x][value], [signal y][value]

Figure 8:
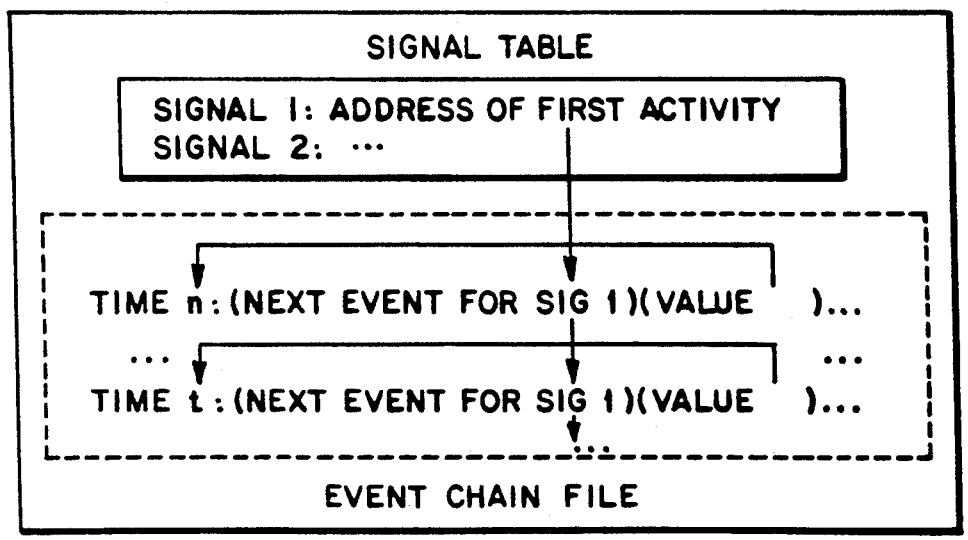
FIG. 8 is a diagram of an index program format, according to the present invention.

The index program processes the simulation results and creates two files; a signal table and an event chain file. Each record in the signal table holds a name, followed by the address of the first activity for that signal. The data in the event chain file is structured in a format similar to the event listings. However, "signal name" is replaced by the address of the next event for that signal. In addition, the value field holds both the logic value (2-bits) and the relative address of the simulation time for this event. This is illustrated in FIG. 8.

Diagnosis Methodology

The approach to analyzing a DUT begins by converting simulation results from MDE into ASIX test vectors. These vectors supply stimulus to the DUT. Differences between the measured and expected data at the I/O level are displayed on the terminal. The tester is then instructed to cycle through the vectors repeatedly. This cycling will provide the external trigger necessary for the e-beam prober to acquire waveforms on the scope window.

The test head with the DUT is mounted on the vacuum chamber lid. Once the DUT is under vacuum, a live image can be displayed in the SEM window. The SEM window and the layout window are then locked together so that positioning in either window will be tracked in the other. The schematic editor is used to navigate through the design.

A device net can be analyzed as follows:

a) a net of interest is selected on the logic (schematic) diagram in the schematic window;

b) this net is highlighted on the layout window, and the corresponding area on the DUT is automatically positioned in the SEM window;

c) the net is then probed with the e-beam, and the waveform is displayed in the scope window;

d) the live waveform (step c) is stored on the screen;

e) the simulator (224) is invoked via an operations menu;

f) the required parameters such as net name, delay time, tester frequency, start vector and display color can be set, or default values can be used; and g) the simulated waveform is displayed in the scope window along with the actual measured waveform, and a comparison can be made.

If the measured and simulated waveforms do not match, a failing net has been located. The schematic tool is then used to follow the failing path through the device logic. Nodes are probed along the path, and measured versus simulated waveform comparisons are made until the failure mechanism is found.

There has been described above a particular implementation of the present invention. More generally, the invention is useful for pinpointing and analyzing failures in gate-intensive devices with small (e.g., submicron) geometries.

By way of summary, I/O failures in a physical device may first be recognized by standard techniques, using a tester, logic analyzer, or the like. However, these tools can only test the input and output (I/O) pins of a device, providing a starting point for more detailed analysis proceeding from the faulty input or output to suspect failing gates (device elements). A tester, alone, cannot sort through the many mask layers and meters of interconnects on a device, to identify the failing circuit element.

A failure tree is created by sorting through circuit elements connected to the failing I/O. Each path connecting to the failed I/O must be rigorously checked. Preferably, this is done through the schematic editor of an ECAD system, working from failing outputs to identify failing circuit elements.

Then, the device must be re-exercised, to duplicate the failure, while probing individual circuit elements to find the source of the failure.

By using a preferably non-destructive probe, preferably along with a microscope tool (e.g., SEM) to assist in positioning the probe, individual circuit elements can be analyzed while the device is failing.

The ECAD system conveniently provides test vectors for the tester, and also provides simulation results for suspect failing circuit elements. The simulation results can be compared with the measured results for any circuit element.

Conveniently, the ECAD system also provides the user interface for navigating through the schematic and layout databases, for controlling position of the probe and SEM.

The test vectors are cycled through DUT, responses are compared to simulation results, and failing patterns are highlighted. This confirms that the analyzer is replicating the failure.

The DUT's schematics and physical layout data bases are loaded from MDE files. The MDE links the LSED schematics to the layout database. The Prober aligns and locks the layout database to the SEM image.

Using the schematic editor, nodes are selected for probing, and are automatically highlighted in the layout presentation. Through the layout or SEM presentation, the probe is focused on a precise gate to examine. These two presentations are linked to track one another, and the ability to move precisely in one or the other is key to navigating through the sub-micron world of the DUT.

The ability to view the layout database allows the user to pinpoint the inputs and outputs of the precise gate or transistors in question.

With the complete layout data base accessible, the user can identify components of individual logic elements so that they can be located and probed, including diffusions, vias, contacts, poly and metal layers.

Once the correct position on the layout is identified, attention shifts to the SEM window. The user controls the SEM, and views the image in real time. Magnification, focus, brightness, contrast (all from sun) clear image of metal layers.

The ability to compare live to simulated waveforms is also provided. The probe's physical accuracy in finding its target is approximately 0.2 $\mu$m, and timing resolution is on the order of 200 ps. The timing can be adjusted to focus in on the waveform at the moment of failure. The probe can be placed on any part of the transistor using the mouse. The probe measures the voltage at that point, and produces an analog waveform.

The simulated versus live waveform presentation can be analyzed in a number of ways, including checking the pulse width of a signal for setup and hold violations.

During this testing, the DUT remains intact, while node after node in the failure tree is examined, until the problem is solved.

The ability to directly compare simulated and physical reality is especially beneficial as device geometries continue to shrink.

Appendices

Appended hereto, and forming part of the disclosure, are the following:

1. "link.c", two-page code listing.
2. "waveform.hxx", eleven page code listing.
3. "An Integrated ASIC Diagnosis System", by Halaviati, Jefferson and Shastry, four-page paper presented May 13–16, 1990 at Custom Integrated Circuit Conference (CICC), Boston, Mass.
4. "E-Beam Probing for VLSI Circuit Debug", by Richardson, *VLSI Systems Design*, August, 1987.
5. "Scanning Electron Microscopes", by Harari and Talbot, *Evaluation engineering*, August, 1987.
6. "Local field Effect & Device Voltage Measurement", by Schlumberger Tech., *Issues in VLSI Diagnostics and Test*, July, 1987, Vol. 1, Num. 1.
7. "Integrated Design Information for Diagnosis", by Liu, *IEEE DAC Proceedings* 1987, Paper 15.3.
8. "IDS 5000 Integrated Diagnostic System", 6-page pamphlet, Schlumberger Technologies, Inc., printed 5/88.

What is claimed is:

1. An integrated system for simulating and analyzing designs of, and for exercising and probing physical implementations of complex circuits comprising:

a schematic editor component of the integrated system for navigating through a design of a circuit, said schematic editor including means for selecting nets of the design, a logic simulator component of the integrated system for providing simulated waveforms at the nets of the design selected in the schematic editor and for providing a set of I/O test vectors, a layout program component of the integrated system providing a net-list level circuit layout of the design;

a tester component of the integrated system for applying the test vectors to external nodes of a physical implementation of the design;

a probe component of the integrated system for measuring live waveforms at a specific node on the physical implementation of the design;

a software layer component of the integrated system, including a user interface and a programmatic interface, linking the schematic editor component to the probe component;

means for positioning the probe in response to nets selected on the schematic editor to measure the live waveform at nodes corresponding to the selected nets;

an interface component of the integrated system for synchronizing operation of the schematic editor, logic simulator, tester, and probe components;

means for displaying in the integrated system the live waveforms and the simulated waveforms corresponding to the selected nets, in real time and side-by side with one another on a single display screen.

2. An integrated system for simulating and analyzing designs of, and for exercising and probing physical implementations of complex circuits, according to claim 1, further comprising:

means for comparing the simulated and live waveforms for the selected nets.

3. A method of diagnosing integrated circuits, comprising:

a) selecting one or more nets of interest on a display of a schematic diagram;

b) highlighting the selected nets on a display and automatically positioning a probe at a corresponding area on a device under test;

c) probing the selected net on the DUT with an e-beam;

d) displaying a live waveform for the selected net;

e) storing the live waveform;

f) simulating a waveform for the selected net;

g) displaying the simulated waveform; and h) comparing the simulated and live waveforms;

wherein the steps of probing the selected net, displaying the live waveform and storing the live waveform include:

providing a set of stimuli to external pins of the DUT, said stimuli corresponding to patterns of stimuli applied when simulating the waveform for the selected net;

instructing the probe to sample the live waveform at the corresponding area on the DUT such that the live waveform corresponds in time to the simulated waveform; and retrieving the live waveform from the probe tool and storing it in a memory.

4. A method of testing integrated circuits, comprising:

(a) providing a schematic design of an integrated circuit on an ECAD system;

(b) providing a set of test vectors on the ECAD system for the integrated circuit, said test vectors corresponding to waveforms to be applied to external input nodes of the integrated circuit;

(c) providing, on the ECAD system, a set of expected results corresponding to waveforms expected to be observed at external output nodes (pins) of the integrated circuit when exercised according to the test vectors;

(d) providing a physical implementation of the integrated circuit as a device under test (DUT);

(e) exercising the DUT according to the test vectors;

(f) detecting a faulty external output node of the DUT for which output signals resulting from step (e) differ from the expected results;

(g) generating a list of internal DUT circuit elements associated with each of the faulty external output node for probing;

(h) re-exercising the DUT;

(i) probing a circuit element on the DUT from the list of circuit elements while re-exercising the inputs;

(j) viewing live waveforms from the element being probed in step (i);

(k) viewing simulated waveforms for the element being probed;

(l) comparing the simulated waveforms (step (k) and the live waveforms (step (j)); and (m) repeating the steps (h) through (l), element by element, until a faulty element is located.

5. A method according to claim 4, further comprising:

(n) repeating the steps (h) through (m) until every element in the list of elements has been probed.

* * * * *